United States Patent [19]

Johnson, III

[11] Patent Number: 5,023,891
[45] Date of Patent: Jun. 11, 1991

[54] METHOD AND CIRCUIT FOR DECODING A MANCHESTER CODE SIGNAL

[75] Inventor: Hoke S. Johnson, III, Monte Sereno, Calif.

[73] Assignee: SF2 Corporation, Sunnyvale, Calif.

[21] Appl. No.: 385,534

[22] Filed: Jul. 25, 1989

[51] Int. Cl.⁵ .......................... H03D 3/22; H04L 27/22
[52] U.S. Cl. ........................................ 375/87; 375/95; 341/70
[58] Field of Search ............... 375/87, 55, 110, 95; 360/42, 40, 51; 341/70; 328/132; 371/55

[56] References Cited

U.S. PATENT DOCUMENTS

| | | | |
|---|---|---|---|
| 3,008,124 | 11/1961 | Warnock | 375/55 |
| 3,026,482 | 3/1962 | Filipowsky | 328/132 |
| 3,108,261 | 10/1968 | Miller | 360/38.1 |
| 3,244,986 | 4/1966 | Rumble | 375/56 |
| 3,493,868 | 2/1970 | Hackett | 375/110 |
| 3,514,706 | 5/1970 | Dupraz | 375/87 |
| 3,594,738 | 7/1971 | Callens | 340/174.1 |
| 3,659,286 | 4/1972 | Perkins | 375/55 |
| 3,804,982 | 4/1974 | Brown | 375/111 |
| 3,836,956 | 8/1974 | Cross | 371/57 |
| 3,859,634 | 1/1975 | Perron et al. | 235/382 |
| 3,866,175 | 2/1975 | Seifert, Jr. et al. | 340/825.1 |
| 3,885,089 | 5/1975 | Callais et al. | 455/3 X |
| 3,886,302 | 5/1975 | Kosco | 455/4 X |
| 3,896,262 | 7/1975 | Hudspeth et al. | 455/6 X |
| 3,919,652 | 11/1975 | Morrien | 329/306 |
| 3,924,068 | 12/1975 | Fletcher | 375/113 |
| 3,962,647 | 6/1976 | Richman | 328/59 |
| 3,967,061 | 6/1976 | Dobias | 395/110 |
| 3,967,062 | 6/1976 | Dobias | 375/110 |
| 3,979,692 | 9/1976 | Benoist | 331/1 A |
| 3,979,746 | 9/1976 | Jarrett | 424/1.1 |
| 3,980,825 | 9/1976 | Morrien | 375/55 |
| 4,027,335 | 5/1977 | Miller | 360/40 |
| 4,029,900 | 6/1977 | Addeo | 375/114 |
| 4,080,572 | 3/1978 | Hastings | 375/95 |
| 4,088,832 | 5/1978 | Eastmond | 375/110 |
| 4,136,400 | 1/1979 | Caswell et al. | 364/900 |
| 4,156,798 | 5/1979 | Doelz | 370/85.12 |
| 4,160,131 | 7/1979 | Kaul et al. | 370/58.2 |
| 4,167,760 | 9/1979 | Decker | 360/40 |
| 4,185,273 | 1/1980 | Gowan | 375/87 X |
| 4,222,116 | 9/1980 | Groves | 375/55 |
| 4,234,897 | 11/1980 | Miller | 360/45 |
| 4,241,398 | 12/1980 | Carll | 364/200 |
| 4,242,755 | 12/1980 | Gauzan | 375/114 |
| 4,254,501 | 3/1981 | Griffith | 375/9 |
| 4,257,125 | 3/1981 | Theall | 455/608 |
| 4,257,126 | 3/1981 | Theall | 455/619 |
| 4,266,198 | 5/1981 | Spada | 329/307 |
| 4,276,656 | 6/1981 | Petryk, Jr. | 455/608 |
| 4,281,292 | 7/1981 | Caldarella | 329/307 |
| 4,287,596 | 9/1981 | Chari | 375/49 |
| 4,292,626 | 9/1981 | Smithlin | 341/70 |
| 4,302,845 | 11/1981 | McClaughry | 375/82 |
| 4,313,206 | 1/1982 | Woodward | 375/87 X |

(List continued on next page.)

FOREIGN PATENT DOCUMENTS 2234203 1/1974 Fed. Rep. of Germany .
59-171242 9/1984 Japan .
2171277 8/1986 United Kingdom .

OTHER PUBLICATIONS

Norton, "Drop Your Costs, but not Your Bits with a Manchester-Data Decoder," *Electronic Design* 15, Jul. 19, 1979, pp. 110–116.

(List continued on next page.)

Primary Examiner—Benedict V. Safourek
Assistant Examiner—Tesfaldet Bocure
Attorney, Agent, or Firm—Mark D. Rowland

[57] ABSTRACT

A circuit for decoding a high speed Manchester encoded digital communication signal is provided. The circuit includes a pair of latch circuits which are used to detect clock edges in the encoded signal for providing respectively set and reset pulses to a third latch circuit, an output of which comprises the decoded data of the Manchester code signal. Additional logic is provided to extract a clock signal from the Manchester code signal.

13 Claims, 3 Drawing Sheets

U.S. PATENT DOCUMENTS

| | | | |
|---|---|---|---|
| 4,317,211 | 2/1982 | Quesnell, Jr. | 375/87 |
| 4,332,027 | 5/1982 | Malcolm et al. | 375/85.3 |
| 4,337,465 | 6/1982 | Spracklen et al. | 340/825.03 |
| 4,344,038 | 8/1982 | Streeter | 328/138 |
| 4,346,452 | 8/1982 | Groves | 364/900 |
| 4,355,378 | 10/1982 | Dennis et al. | 367/33 |
| 4,355,423 | 10/1982 | Theall | 455/608 |
| 4,361,895 | 11/1982 | Khoudari | 375/87 |
| 4,363,002 | 12/1982 | Fuller | 331/1 A |
| 4,389,721 | 6/1983 | Young et al. | 370/85.11 |
| 4,410,889 | 10/1984 | Bryant et al. | 340/825.2 |
| 4,423,414 | 12/1984 | Bryant et al. | 340/825.07 |
| 4,426,714 | 1/1984 | Ashida | 375/110 |
| 4,428,061 | 1/1984 | Skinner et al. | 364/715.11 |
| 4,430,651 | 2/1984 | Bryant et al. | 340/825.52 |
| 4,441,162 | 4/1984 | Lillie | 364/900 |
| 4,449,119 | 5/1984 | Hanna et al. | 341/70 |
| 4,449,202 | 5/1984 | Knapp et al. | 364/900 |
| 4,450,572 | 5/1984 | Stewart et al. | 375/87 |
| 4,453,229 | 6/1984 | Schaire | 364/900 |
| 4,468,791 | 8/1984 | Masek | 375/87 |
| 4,475,212 | 10/1984 | McLean et al. | 375/17 |
| 4,493,021 | 1/1985 | Agrawal et al. | 364/200 |
| 4,494,241 | 1/1985 | Mayoux | 375/76 |
| 4,495,574 | 1/1985 | Hofstetter | 364/200 |
| 4,507,794 | 3/1985 | Jones et al. | 375/55 |
| 4,510,494 | 4/1985 | Mizokawa et al. | 370/85.8 X |
| 4,513,329 | 4/1985 | Gomez et al. | 360/42 |
| 4,513,427 | 4/1985 | Borriello et al. | 375/110 |
| 4,525,848 | 6/1985 | Simpson | 375/87 |
| 4,531,223 | 7/1985 | Ashida | 375/110 |
| 4,535,297 | 8/1985 | Puckette | 329/303 |
| 4,542,420 | 9/1985 | Kozlik | 360/42 |
| 4,545,055 | 10/1985 | Patel | 371/1 |
| 4,549,290 | 10/1985 | Bell | 370/32 |
| 4,556,869 | 12/1985 | Thomson | 341/70 |
| 4,556,884 | 12/1985 | Howells et al. | 340/860 |
| 4,562,582 | 12/1985 | Tokura et al. | 375/87 |
| 4,565,976 | 1/1986 | Campbell | 31/57 |
| 4,567,604 | 1/1986 | Jacksier | 375/111 |
| 4,573,169 | 2/1986 | van Gerwen | 375/55 |
| 4,575,712 | 3/1986 | Winick | 340/539 |
| 4,578,799 | 3/1986 | Scholl | 375/87 |
| 4,581,725 | 4/1986 | Pilarcik, Jr. | 375/76 X |
| 4,592,033 | 5/1986 | Dennis | 375/36 X |
| 4,592,072 | 5/1986 | Stewart | 375/87 X |
| 4,603,322 | 7/1986 | Blair | 341/70 |
| 4,605,921 | 8/1986 | Riddle et al. | 371/37.2 |
| 4,606,050 | 8/1986 | Sekigawa | 375/75 |
| 4,606,052 | 8/1986 | Hirzel et al. | 375/87 |
| 4,606,053 | 8/1986 | Schroder | 375/87 |
| 4,608,702 | 8/1986 | Hirzel et al. | 375/110 |
| 4,623,997 | 11/1986 | Tulpule | 370/85.1 |
| 4,625,307 | 11/1986 | Tulpule et al. | 370/85.13 |
| 4,631,586 | 12/1986 | Gennetten et al. | 358/148 |
| 4,631,733 | 12/1986 | Spiesman | 371/20.5 |
| 4,635,254 | 1/1987 | Tulpule et al. | 370/85.1 |
| 4,641,300 | 2/1987 | Wurst | 370/16 |
| 4,651,316 | 3/1987 | Kocan et al. | 370/85.7 |
| 4,652,944 | 3/1987 | Tindall | 360/37.1 |
| 4,661,950 | 4/1987 | Kobayashi et al. | 370/85.2 |
| 4,661,965 | 4/1987 | Maru | 375/110 |
| 4,663,706 | 5/1987 | Allen et al. | 364/200 |
| 4,663,743 | 5/1987 | Rampuria et al. | 367/68 |
| 4,663,748 | 5/1987 | Karbowiak et al. | 370/85.4 |
| 4,663,767 | 5/1987 | Bodlaj | 375/55 |
| 4,665,519 | 5/1987 | Kirchner et al. | 370/94.1 |
| 4,667,218 | 5/1987 | Allen et al. | 357/63 |
| 4,667,323 | 5/1987 | Engdahl et al. | 370/85.4 |
| 4,670,872 | 6/1987 | Cordill | 370/85.2 |
| 4,672,605 | 6/1987 | Hustig | 370/76 |
| 4,674,086 | 6/1987 | Szczepanek | 370/85.5 |
| 4,675,884 | 6/1987 | Nakamura et al. | 375/87 |
| 4,679,193 | 7/1987 | Jensen et al. | 370/94.1 |
| 4,680,811 | 7/1987 | Harper et al. | 455/617 |
| 4,688,232 | 8/1987 | Fox | 375/87 |
| 4,695,952 | 9/1987 | Howland | 364/200 |
| 4,707,823 | 11/1987 | Holdren et al. | 370/1 |
| 4,718,011 | 1/1988 | Patterson, Jr. | 364/922 |
| 4,720,828 | 1/1988 | Jones | 370/85.1 |
| 4,727,592 | 2/1988 | Okada et al. | 455/601 |
| 4,730,250 | 3/1988 | Girard et al. | 364/200 |
| 4,736,368 | 4/1988 | Szczepanek | 370/85.5 |
| 4,740,909 | 4/1988 | Conklin et al. | 364/900 |
| 4,745,626 | 5/1988 | Wells | 375/87 |
| 4,746,898 | 5/1988 | Loeppart | 375/110 X |
| 4,747,100 | 5/1988 | Roach et al. | 370/85.5 |
| 4,752,942 | 6/1988 | Iwakami | 375/110 |
| 4,759,040 | 7/1988 | Kawata et al. | 375/111 |
| 4,763,338 | 8/1988 | Barndt, Sr. | 375/82 |
| 4,769,723 | 9/1988 | Tran | 365/39 |
| 4,775,983 | 10/1988 | Larimer | 375/10 |
| 4,780,869 | 10/1988 | Engdahl et al. | 370/16 |
| 4,781,427 | 11/1988 | Husbands et al. | 350/96.16 |
| 4,785,448 | 11/1988 | Reichert et al. | 370/76 |
| 4,789,961 | 12/1988 | Tindall | 364/900 |
| 4,792,753 | 12/1988 | Iwai | 370/13 |
| 4,805,197 | 2/1989 | Van der Jagt et al. | 375/110 |

(List continued on next page.)

U.S. PATENT DOCUMENTS 4,807,260  2/1989  Solina .................................. 375/110
4,809,301  2/1989  Rhodes ................................. 375/87

OTHER PUBLICATIONS

Sanders, "Single-Chip Encoder-Decoder Converts NRZ into Manchester Code," *Electronics,* Jul. 28, 1982, pp. 105-109.

Sanders, "For Data-Comm Links, Manchester Chip Could be Best," *Electronic Design*, Aug. 5, 1982, pp. 201-212.

Costlow, "From Chip to Work Station, Greater Integration Prevails," *Electronic Design*, Oct. 27, 1983, pp. 95-100.

Pittroff and Cooper, "VLSI Manchester Encoder-Decoder Suits the Ethernet System," *Electronics*, Nov. 17, 1983, pp. 148-150.

Haung and Moseley, "Manchester Chip Eases the Design of Ethernet Systems," *Electronic Design,* Jul. 26, 1984, pp. 221-228.

Rao et al., "Manchester Decoder Using SN-7474", International Journal of Electronics, vol. 49, No. 2, Aug. 1980, pp. 175-177.

Alfke, "Exclusive-OR Gates Simplify Modem Designs," Electrical Design News, vol. 17, No. 18, 1972, p. 2119.

METHOD AND CIRCUIT FOR DECODING A MANCHESTER CODE SIGNAL

BACKGROUND OF THE INVENTION

The present invention relates to a circuit for extracting separate data and clock signals from a Manchester encoded digital communication signal.

Manchester encoding is commonly used in bit-serial digital communications, and numerous types of Manchester decoder circuits exist in the prior art. Many of these circuits are incapable of accurately decoding a Manchester signal at high speed, typically because signal propagation delays in the components of the circuits are either too long (i.e., the circuit is slow) or not sufficiently controllable. Such circuits include those having one-shot logic circuits and those implemented using TTL logic. Further, of the prior art Manchester decoder circuits that are capable of reliable operation at high speed, many are complicated and expensive. Such circuits include phase-locked loop circuits and fast-sampling state machines.

SUMMARY OF THE INVENTION

The present invention is a reliable method and circuit for decoding a Manchester encoded signal. The circuit includes a pair of latch circuits which are used to detect transitions or edges in the encoded signal for providing respectively set and reset pulses to a third latch circuit, an output of which comprises the decoded data of the Manchester signal. The circuit also includes two delay elements, input and delay matching buffers, and one or more logic gates. Logical combination of the decoded data with a delayed encoded signal provides a decoded clock. The circuit can be implemented using fast ECL devices in a single integrated circuit. In a preferred embodiment, the latch circuit pair comprise flip-flop logic circuits matched on an integrated circuit to equalize signal propagation delays through the flip-flops.

BRIEF DESCRIPTION OF THE DRAWINGS

The above and other advantages of the present invention will be apparent upon consideration of the following detailed description, taken in conjunction with the accompanying drawings, in which.

DETAILED DESCRIPTION OF THE INVENTION

Manchester encoding is a method of combining a serial data stream and a synchronized clock signal into a single signal. It can be accomplished, for example, by combining a serial data stream of NRZ data with a synchronized 50% duty cycle clock signal in an exclusive-NOR logical operation. As a result of this operation, the data becomes encoded as a series of two-bit codes. A logical "1" is represented as a data bit cell in which the signal is at a high level for the first half of the data bit cell and at a low level for the second half. Thus a logical "1" is encoded as a two-bit code 1,0 each code bit cell being one-half the data bit cell. A logical "0" is represented as a data bit cell in which the signal is at a low level for the first half of the data bit cell and at a high level for the second half. Thus a logical "0" is encoded as a two-bit code 0,1.

By examining examples of typical Manchester encoded data streams, it can be seen that a transition in the original data from a logical "0" to a logical "1" causes the Manchester encoded data stream to contain a sequence of two code bits equal to 1. Likewise when the original data transitions from a logical "1" to a logical "0", the Manchester encoded data stream contains a sequence of two code bits equal to 0. At all other times, i.e., when the original data is a stream of consecutive logical "1"s or "0"s, the Manchester encoded data stream consists of alternating 1 and 0 code bits.

Figure 1:
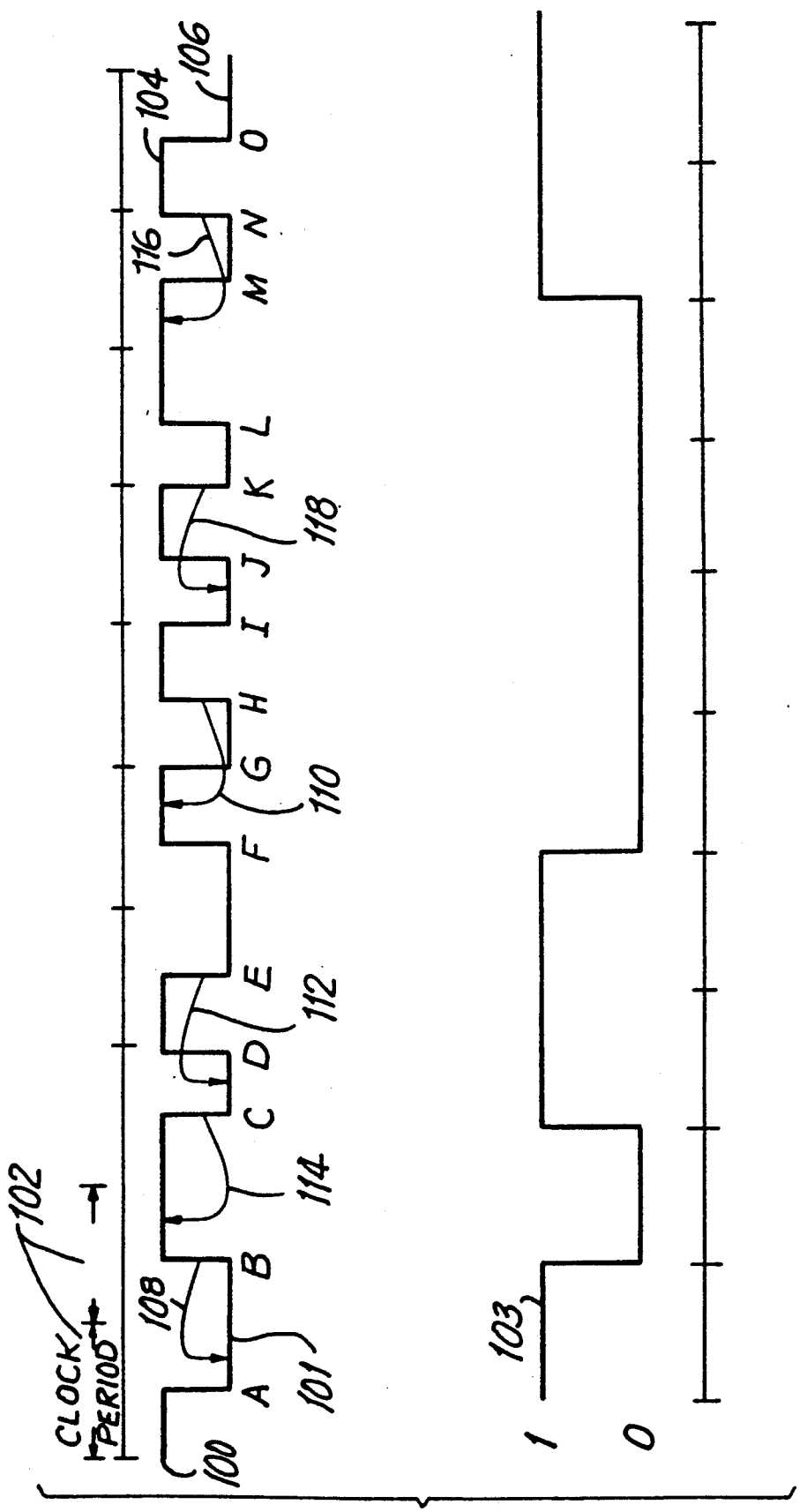
FIG. 1 is a signal diagram illustrating the method of the present invention.

Referring to FIG. 1, an exemplary Manchester encoded waveform 100 having clock periods 102 is shown. Each clock period 102 defines a data bit cell including two code bit cells (e.g., high state code bit cell 104 and low state code bit cell 106). Waveform 100 has falling edge transitions A,C,E,G,I,K,M and O and rising edge transitions B,D,F,H,J,L and N. Transitions A,B,-C,E,F,H,J,L,M and O each occurs in the center of a clock period, and thus each conveys information: the falling edge transitions represent logical "1's", and the rising edge transitions represent logical "0's". Transitions D,G,I,K and N each occur at an edge of a clock period, and thus do not convey data. The preferred method of the present invention for extracting a data signal from a Manchester encoded waveform is described below with reference to the exemplary waveform of FIG. 1.

As a first step in the preferred method, each transition in the waveform is detected, although, as will be apparent, it is only necessary to detect the transitions occurring in the middles of clock periods 102. For each detected transition, the state (high or low) of the waveform 100 between one-half and one clock period preceding the detected transition is determined. Thus, for example, assuming transition B to have been detected, the state (low) of waveform 100 at point 101 is determined.

An output signal 103 is then generated having a first and a second state, preferably comprising respectively a low state to represent a logical "0" in the encoded data and a high state to represent a logical "1", although an inverse relationship may also be used if desired to represent the original data. The output signal, the clock periods of which may be delayed with respect to the clock periods of waveform 100, is characterized by the following rules based on the direction of the detected transitions and the correspondingly determined state of waveform 100:

a. if a detected transition is a rising transition and the determined state of the waveform is a low state (e.g., the conditions shown by arrow 108), the output signal (which in the example is assumed to begin as a logical "1") changes from a high state to a low state;

b. if a detected transition is a rising transition and the determined state of the waveform is a high state (e.g., the conditions shown by arrow 110), the output signal remains in its previous state;

c. if a detected transition is a falling transition and the determined state of the waveform is a low state (e.g., the conditions shown by arrow 112), the output signal again remains in its previous state; and d. if a detected transition is a falling transition and the determined state of the waveform is a high state (e.g., the conditions shown by arrow 114), the output signal changes from a low state to a high state.

As can be seen, transitions which occur at an edge of the clock period (e.g., 116 and 118) are governed by rules (b) and (c) above, and thus produce no change in output signal 103.

Figure 2:
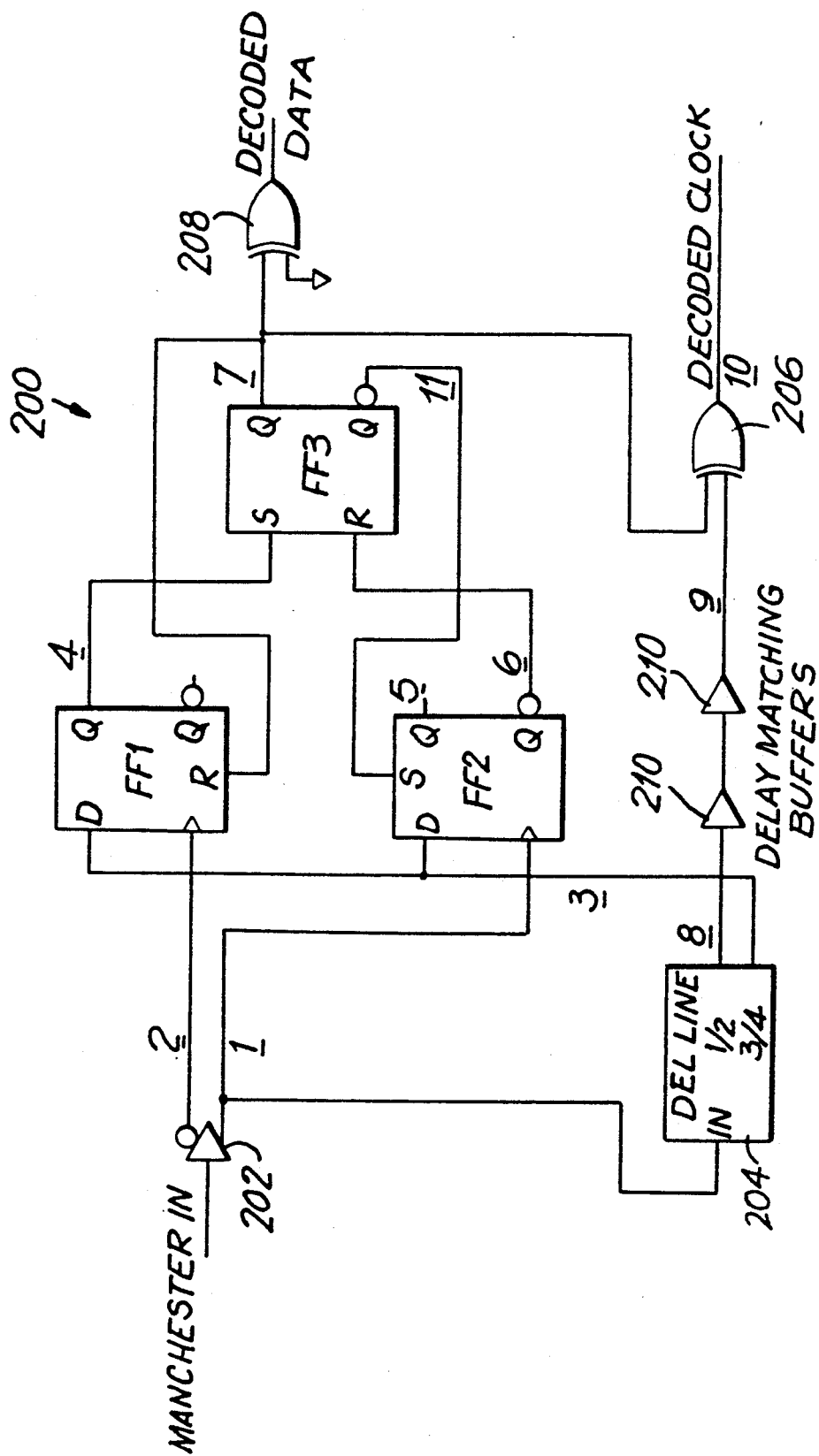
FIG. 2 is a schematic of an embodiment of the Manchester decoder circuit of the present invention.
Figure 3:
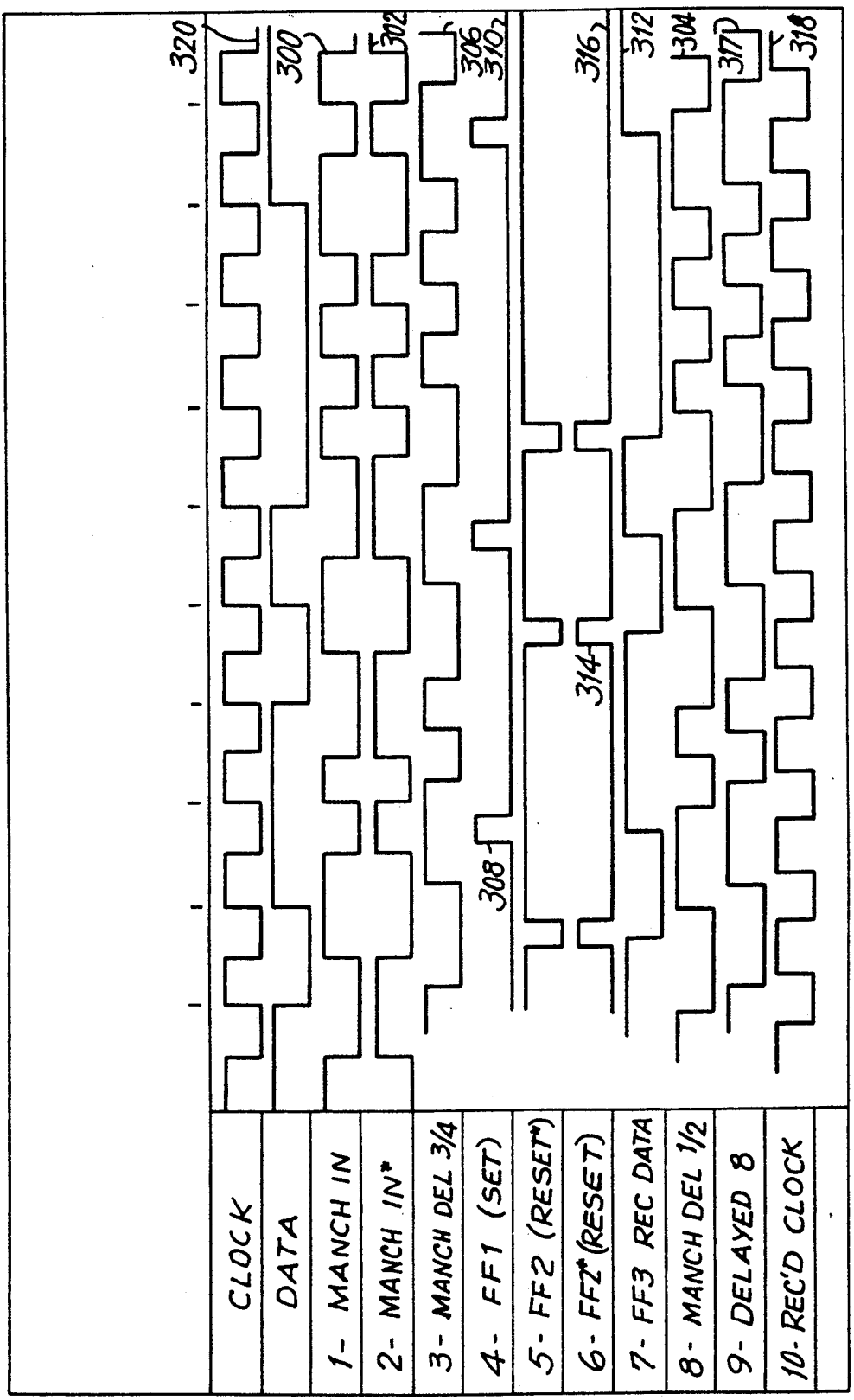
FIG. 3 is a timing diagram of the circuit of FIG. 2.

An embodiment 200 of the Manchester decoder circuit of the present invention is shown in FIG. 2. For purposes of illustration, a timing diagram of the circuit 200 of FIG. 2 is shown in FIG. 3, with corresponding signal points indicated in each figure. Referring to FIGS. 2 and 3, a Manchester encoded signal 300 is coupled through buffer circuit 202 to the clocking input of flip-flop FF2 and to the input of delay element circuit 204. Buffer circuit 202 also inverts the encoded signal 300 and provides inverted signal 302 to the clocking input of flip-flop FF1.

Delay element circuit 204 generates delayed by encoded signals 304 and 306. Signal 304 is delayed by ½ of a clock period of the original clock encoded in signal 300, and signal 306 is delayed by ¾ of a clock period. The length of the delay depends on the speed at which data is transferred to circuit 200. For example, at a data transfer rate of 100 Megabits per second, delay element circuit 204 would be implemented to delay signal 304 by 5.0 nanoseconds(ns), and signal 306 by 7.5 ns. Delay element circuit 204 may be implemented using a fixed or programmable delay line circuit. Alternately, if it is desired that circuit 200 be implemented in a fully integrated circuit, delay element circuit 204 may be implemented as a high-speed clock circuit and a multiple-output shift register circuit to generate the delayed signals 304 and 306.

Delayed encoded signal 306 is provided to the data input D of each flip-flop FF1, FF2. Flip-flops FF1 and FF2 are rising edge triggered flip-flop circuits. FF1 samples delayed encoded signal 306 when the inverted encoded signal 302 at its clocking input transitions from a low level to a high level (i.e., on a rising edge of inverted signal 302). Thus in effect FF1 is clocked once for each falling edge of encoded signal 300. FF2 samples delayed encoded signal 306 when the original encoded signal 300 at its clocking input transitions from a low level to a high level (i.e., on a rising edge of encoded signal 300). As described above, it is a property of a Manchester encoded signal that a transition occurs in the midpoint of every data cell due to the encoded clock signal. The encoded data is represented by the direction of that transistion. Thus, depending on the data represented in each data cell of the encoded signal, either FF1 or FF2 will be clocked by an edge or transition at the midpoint of each data cell. Although edges are also present at the boundaries of the data cells, these transitions do not cause the latched data output of either flip-flop FF1 or FF2 to change because the data at the input of the flip-flop will be the same as the data previously latched.

The data signal at the D input of FF1 (delayed signal 306) represents the original encoded signal 300 delayed by ¾ of a data cell, which is equivalent to 1½ code bit cells. If, when a rising edge transition in inverted signal 302 causes FF1 to sample the data at its D input, the sampled data is a 1, then it is known that original encoded signal 300 has been a 1 for two consecutive code bit cells and that the decoded data should change from a logical "0" to a logical "1". Flip-flop FF1 accordingly outputs a 1 on its Q output which is coupled to the set control input of an SR flip-flop FF3. This transition, shown for example by point 308 on signal 310, causes the Q output of FF3 to be set to a "1". The signal 312 at the Q output of flip-flop FF3 is coupled back to the reset control input of FF1 to cause signal 310 at the Q output of FF1 to return to 0 after FF3 has been successfully set. This prevents flip-flop FF1 from trying to set flip-flop FF3 at the same time flip-flop FF2, the operation of which is described below, may try to reset flip-flop FF3.

If, on the other hand, the data at the D input of flip-flop FF1 is a 0 when sampled, it is known that original encoded signal 300 has not been a 1 for two consecutive code bit cells, indicating that the encoded data has not changed from a logical "0" to a logical "1". Therefore flip-flop FF1 remains in the 0 state (i.e., the signal at Q output of FF1 remains 0) and FF3 is not set. This is the result, for example, whenever flip-flop FF1 is clocked by an edge at the boundary of a data cell.

Flip-flop FF2 operates in a similar manner to reset FF3 whenever the data at its D input (delayed signal 306) is a 0 when flip-flop FF2 is clocked by a rising edge in signal 300. As in the case of FF1, the data signal at the D input of FF2 (delayed signal 306) represents the original encoded signal 300 delayed by ¾ of a data cell, which is equivalent to 1½ code bit cells. If, when a rising edge transition in non-inverted signal 300 causes FF2 to sample the data at its D input, the sampled data is a 0, then it is known that original encoded signal 300 has been a 0 for two consecutive code bit cells and that the decoded data should change from a logical "1" to a logical "0". Flip-flop FF2 accordingly outputs a 1 on its inverted Q output which is coupled to the reset control input of SR flip-flop FF3. This transition, shown for example by point 314 on signal 316, causes the Q output of FF3 to be set to a "0". The signal at the inverted Q output of flip-flop FF3 is coupled back to the set control input of FF2 to cause signal 316 at the inverted Q output of FF2 to return to 0 after FF3 has been successfully reset. This coupling back prevents flip-flop FF2 from trying to reset flip-flop FF3 at the same time flip-flop FF1 may be trying to set flip-flop FF3.

If, on the other hand, the data at the D input of flip-flop FF2 is a 1 when sampled, it is known that original encoded signal 300 has not been a 0 for two consecutive code bit cells, indicating that the encoded data has not changed from a logical "1" to a logical "0". Therefore flip-flop FF2 remains in the 1 state (i.e., the signal at inverted Q output of FF2 remains 0) and FF3 is not reset. This is always the result when flip-flop FF2 is clocked by an edge at a boundary of a data cell.

The Q output of flip-flop FF3 is coupled to an input of each of exclusive-OR logic gates 206 and 208. A second input of logic gate 206 is coupled to to the ½ clock period delay line of delay element circuit 204 by a plurality of delay matching buffer circuits 210. The Manchester encoded data signal delayed by ½ clock period (signal 304) is combined with the decoded data at the Q output of FF3 (signal 312) to recover the clock from the encoded signal.

There is a delay in the decoded data of signal 312 relative to the original data encoded in signal 300. This delay includes a ½ data cell delay which, in recovering the clock signal, is compensated for by the delay of ½ clock period in signal 304. There is additional delay in the decoded data due to signal propagation delays through flip-flops FF1/FF2 and FF3. Delay matching buffer circuits 210 compensate for this delay (see signal 317). Preferably, flip-flops FF1, FF2 and FF3, and delay matching buffers 210 are implemented in a single integrated circuit to minimize variations in the signal propagation delays of the different component circuits that might be caused by variations in the semiconductor processes used to manufacture the circuits. ECL devices are preferred because of their speed, although other technologies also may be used. Delay matching buffers 210 can be implemented as desired to emulate the signal propagation delays of the flip-flops during operation. If the circuit is implemented using discrete components, delay matching buffers can be implemented using conventional fixed or programmable delay elements.

The clock signal at the output of exclusive-OR gate 206 (signal 318) is inverted with respect to original clock signal 320. This arrangement is useful for subsequent circuitry because the rising edge of the inverted clock occurs in the center of each data cell of the decoded data (signal 312), thus giving equal set up and hold times for clocking the decoded data into additional circuits. Because the decoded data signal 312 is coupled through exclusive-OR gate 206 to generate the recovered clock 318, the recovered clock will be delayed from the center of the data cells of the decoded data by the propagation delay of exclusive-OR gate 206. If it is desired that the propagation delay of exclusive-OR gate 206 be cancelled, the decoded data signal 312 can be coupled through an optional delay element, such as exclusive-OR gate 208 shown in FIG. 2, preferably in the same integrated circuit, to provide a data signal output having a matching delay.

Thus a novel circuit for decoding a Manchester encoded digital communication signal has been described. One skilled in the art will appreciate that the present invention can be practiced by other than the described embodiments. For example, flip-flops FF1 and FF2 can be replaced by falling edge triggered flip-flops if the clocking inputs provided to the two flip-flops are reversed. Further, each flip-flop can be replaced by other latch circuits having cross-coupled logic gates, and alternate circuitry may be used to condition the control signals provided to set and reset flip-flop FF3 to avoid conflict. The described embodiments are presented for purposes of illustration and not of limitation, and the present invention is limited only by the claims which follow.

What is claimed is:

1. A method for extracting a data signal from a Manchester code signal, the Manchester code signal having low and high states, rising and falling transitions between the low and high states, and a clock period defining data cells, the method comprising the steps of:
    detecting the transitions in the Manchester code signal;
    for each detected transition, determining the state of the Manchester code signal at a point in the Manchester code signal between one-half and one clock period preceding the detected transition; and
    generating an output signal having first and second respectively to low and high states corresponding the output signal being characterized with respect to each detected transition and correspondingly determined state of the Manchester code signal in that:
    a. if a detected transition is a rising transition and the determined state of the Manchester code signal is a low state, the output signal changes from the second state to the first state;
    b. if a detected transition is a rising transition and the determined state of the Manchester code signal is a high state, the output signal remains in its previous state;
    c. if a detected transition is a falling transition and the determined state of the Manchester code signal is a low state, the output signal remains in its previous state; and
    d. if a detected transition is a falling transition and the determined state of the Manchester code signal is a high state, the output signal changes from the first state state to the second state.

2. The method of claim 1 further comprising a method for extracting a clock signal from the Manchester code signal, the clock signal extracting method comprising the steps of:
    delaying the Manchester code signal; and
    combining the generated output signal in an exclusive-OR logic operation with the delayed Manchester code signal.

3. An apparatus for extracting a data signal from a Manchester code signal, the Manchester code signal having low and high states, rising and falling transitions between the low and high states, and a clock period defining data cells, the apparatus comprising:
    means for detecting the transitions in the Manchester code signal;
    means for determining for each detected transition the state of the Manchester code signal at a point in the Manchester code signal between one-half and one clock period preceding the detected transition; and
    means for generating an output signal having first and respectively to low and high states second states, corresponding the output signal being characterized with respect to each detected transition and correspondingly determined state of the Manchester code signal in that:
    a. if a detected transition is a rising transition and the determined state of the Manchester code signal is a low state, the output signal changes from the second state to the first state;
    b. if a detected transition is a rising transition and the determined state of the Manchester code signal is a high state, the output signal remains in its previous state;
    c. if a detected transition is a falling transition and the determined state of the Manchester code signal is a low state, the output signal remains in its previous state; and
    d. if a detected transition is a falling transition and the determined state of the Manchester code signal is a high state, the output signal changes from the first state state to the second state.

4. The apparatus of claim 3 further comprising means for extracting a clock signal from the Manchester code signal, the clock signal extracting means comprising:
    means for delaying the Manchester code signal; and
    means for combining the generated output signal in an exclusive-OR logic operation with the delayed Manchester code signal.

5. An apparatus for decoding a Manchester code signal having data cells each defined by a pair of high state and low state code bit cells and a rising or falling state transition between the code bit cells, the apparatus comprising:
    first and second latch means each having a data input, a clocking input, and a data output, for latching a data signal from the data input to the data output when a clocking edge is present at the clocking input;

means for delaying the Manchester code signal between one and two code bit cells and for supplying the delayed code signal to each of the data inputs of the first and second latch means;

means for clocking the first latch means by providing a clocking edge to the clocking input of the first latch means in accordance with each falling transition of the Manchester code signal;

means for clocking the second latch means by providing a clocking edge to the clocking input of the second latch means in accordance with each rising transition of the Manchester code signal:

means for generating a data output signal at a data output, the data output signal generating means having first and second output respectively to low and high state states corresponding and first and second control inputs;

first circuit means coupled to the first latch means and the data output signal generating means for supplying a first control signal to the first control input of the data output signal generating means when the delayed Manchester code signal supplied to the data input of the first latch means is in a high state when latched by the first latch means, the first control signal causing the data output signal generating means to operate in a first output state; and second circuit means coupled to the second latch means and the data output signal generating means for supplying a second control signal to the second control input of the data output signal generating means when the delayed Manchester code signal supplied to the data input of the second latch means is in a low state when latched by the second latch means, the second control signal causing the data output signal generating means to operate in a second output state, whereby the data output signal generating means generates a data output signal representative of data encoded in the Manchester code signal.

6. The apparatus of claim 5, further comprising means for decoding a clock signal from the encoded data signal.

7. The apparatus of claim 5, wherein the first and second latch means respectively comprise first and second edge triggered flip-flop circuits.

8. The apparatus of claim 7, wherein:

the first and second flip-flop circuits each has a control input;

the data output signal generating means includes means for generating an inverted data output signal;

the first circuit means includes means for supplying one of the data output signal and the inverted data output signal to the control input of the first flip-flop circuit; and the second circuit means includes means for supplying the other of the data output signal and the inverted data output signal to the control input of the second flip-flop circuit.

9. The apparatus of claim 5, wherein the delaying means delays the encoded data signal for one and one-half code bit cells.

10. The apparatus of claim 6, wherein the clock signal decoding means comprises:

second means for delaying the Manchester code signal by at least one code bit cell; and means for coupling the at least one code bit delayed code signal to one input of an exclusive-OR logic gate, another input of which ,is coupled to the data output of the data output signal generating.

11. The apparatus of claim 7, wherein the first and second flip-flop circuits are components of a single integrated circuit.

12. A decoder circuit for generating at a data output an output signal representative of data encoded in a Manchester code signal having a clock period, the circuit comprising:

an input buffer circuit having a data input for receiving a Manchester code signal, an inverting data output and a non-inverting data output;

a delay element having an input coupled to the noninverting data output of the input buffer circuit, and having an output, the delay element having a delay of three-quarters of a clock period;

a first flip-flop circuit having a data input coupled to the output of the delay element, a clocking input coupled to the inverting data output of the input buffer circuit, a non-inverting data output and a reset input;

a second flip-flop circuit having a data input coupled to the output of the delay element, a clocking input coupled to the non-inverting data output of the input buffer circuit, an inverting data output and a set input; and a third flip-flop circuit having a set input coupled to the non-inverting data output of the first flip-flop circuit, a non-inverting data output coupled to the reset input of the first flip-flop circuit and to the data output of the decoder circuit, a reset input coupled to the inverting data output of the second flip-flop circuit, and an inverting data output coupled to the set input of the second flip-flop circuit.

13. The decoder circuit of claim 12, further comprising means for generating at a clock output of the decoder circuit a clock signal representative of the clock encoded in the Manchester code signal, and for generating at the data output of the decoder circuit a synchronized data signal, the means comprising:

an exclusive-OR logic gate having a first data input coupled to the non-inverting data output of the third flip-flop circuit, a second data input and a data output coupled to the clock output of the decoder circuit;

a second delay element having an input coupled to the non-inverting data output of the input buffer circuit, a data output and a delay of one-half of a clock period;

at least one delay matching buffer circuit coupled in series between the data output of the second delay element and the second data input of the exclusive-OR logic gate; and a third delay element coupled between the non-inverting data output of the third flip-flop circuit and the data output of the decoder circuit.

* * * * *

UNITED STATES PATENT AND TRADEMARK OFFICE
CERTIFICATE OF CORRECTION

PATENT NO. : 5,023,891
DATED : June 11, 1991
INVENTOR(S) : Hoke S. Johnson, III

It is certified that error appears in the above-identified patent and that said Letters Patent is hereby corrected as shown below:

Claim 1, column 5, line 58, "respectively to low and high states corresponding" should be -- states corresponding respectively to low and high states, --.

Claim 3, column 6, lines 33-34, "respectively to low and high states second states, corresponding" should be -- second states corresponding respectively to low and high states, --.

Claim 5, column 7 line 15, "code signal:" should be -- code signal; --; lines 18-19, "respectively to low and high state states corresponding" should be -- states corresponding respectively to low and high states --.

Claim 10, column 8, line 10, "which, is" should be -- which is --; line 11, insert -- means -- after "generating".

Signed and Sealed this

Fifth Day of October, 1993

Attest:

BRUCE LEHMAN

*Attesting Officer*     *Commissioner of Patents and Trademarks*